United States Patent [19]

Rischmuller

[11] 4,426,590
[45] Jan. 17, 1984

[54] SWITCH CONTROLLABLE OFF AND ON BY PULSES

[75] Inventor: Klaus Rischmuller, Paris, France

[73] Assignee: Thomson-CSF, Paris, France

[21] Appl. No.: 323,076

[22] Filed: Nov. 19, 1981

[30] Foreign Application Priority Data

Nov. 21, 1980 [FR] France .................. 80 24798

[51] Int. Cl.³ ........................................... H03K 17/00
[52] U.S. Cl. .............................. 307/255; 307/252 R; 307/288; 307/315
[58] Field of Search .................. 307/315, 255, 252 R, 307/288

[56] References Cited

U.S. PATENT DOCUMENTS

| | | | |
|---|---|---|---|
| 3,235,750 | 2/1966 | Anderson et al. | 307/255 |
| 3,449,598 | 6/1969 | Wright . | |
| 3,526,787 | 9/1970 | Stover | 307/255 |
| 3,551,699 | 12/1970 | Karwacki . | |
| 3,952,212 | 4/1976 | Matsamioto et al. | 307/255 |
| 4,221,980 | 9/1980 | Louw et al. . | |
| 4,277,696 | 7/1981 | Tokunaga et al. | 307/315 |

FOREIGN PATENT DOCUMENTS 2914767 4/1979 Fed. Rep. of Germany .

OTHER PUBLICATIONS

Polytechnisch Tijdschrift, vol. 21E, No. 4, 2/16/66, La Haye, Kalisvaart: "Impulsvormen voor een fotodiode in een ponsbandaftaster", pp. 125E–129E.

Primary Examiner—Larry N. Anagnos
Assistant Examiner—B. P. Davis
Attorney, Agent, or Firm—Oblon, Fisher, Spivak, McClelland & Maier

[57] ABSTRACT

A switch comprising two transistors connected in the form of a mixed Darlington circuit. The base of the second transistor is connected to the collector of a third transistor. The emitters of the first and third transistors are interconnected and the base of the third transistor is connected to the base of the third transistor, which is itself connected to the collector of the second transistor and to earth via a polarization resistor. An example of an integrated embodiment is disclosed.

8 Claims, 5 Drawing Figures

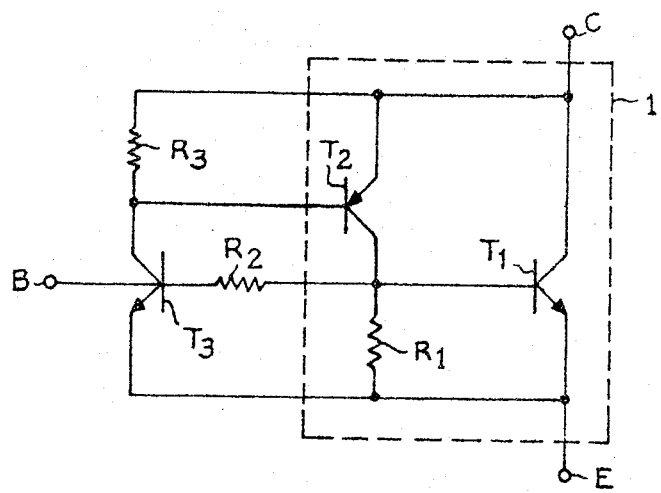
Fig.1
Fig.2 A
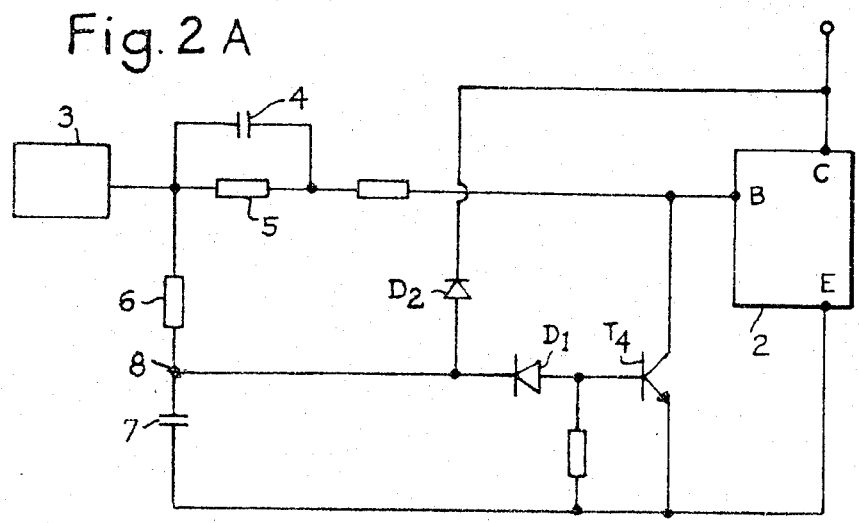
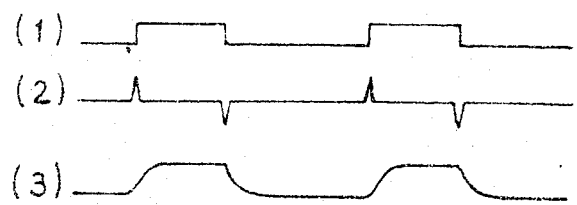
Fig.2 B

SWITCH CONTROLLABLE OFF AND ON BY PULSES

BACKGROUND OF THE INVENTION

1. Field of the Invention

The present invention relates to a switch whose opening and closing is controlled by pulses and the construction of such a switch in the form of an integrated circuit. The present invention is directed more particularly at power switches able to block relatively high voltages and permit the passage of high intensity currents.

2. Description of the Prior Art

At present solid state electronic switches for unidirectional currents are subdivided into three main groups. These groups will be analyzed hereinafter in connection with the control mode of the switch.

The first group comprises devices of the thyristor, gate amplification thyristor and similar types. For controlling the closing of such switches it is necessary to apply a current pulse to the gate thereof. The switch remains conductive as long as a voltage is applied between the main terminals thereof. Such switches cannot be opened simply when a voltage is applied to their terminals. For this purpose it is necessary to provide relatively complex forced switching circuits.

The second group comprises devices of the transistor or Darlington circuit transistor types. These devices are controllable for the opening and closing. For the control thereof it is necessary to apply a base current which must be maintained throughout the conduction period. For opening purposes it is merely necessary to nullify the base current. Devices of this second group have the advantage compared with those of the first group that they require no forced switching circuit for their opening. However, they have the disadvantage that the base current must be applied throughout the conduction period, which complicates the control circuit and leads to consumption in the latter. To limit the consumption in the case of a battery supply it is at present standard practice in Darlington transistor control circuits to use converters for limiting the supply voltage of the base current and thus reduce dissipation in the control circuit.

The third group comprises devices of the gate turn off thyristor type. For closing, such devices require a gate current pulse of reasonable amplitude and short duration. However, the opening of such devices involves the application of a very high amplitude gate current in the opposite direction and which is essentially of the same order of magnitude as the main current passing through the device.

BRIEF SUMMARY OF THE INVENTION

An object of the present invention is to provide a new type of switch which can be controlled both in opening and closing by a pulse of reasonable amplitude, which considerably simplifies the control circuits and makes it possible to directly use control signals supplied by integrated control circuits without having to provide complex interfaces.

Another object of the invention is to provide such a switch which can be combined in simple manner with a relatively simple safety circuit.

Another object of the invention is to provide such a switch which can be constructed in integrated form.

A switch whose opening and closing can be controlled by pulses according to the present invention comprises: main terminals corresponding to the collector and the emitter of a first power transistor of a first type (npn or pnp) and a second transistor of a second type connected by its emitter to the collector of the first transistor and by its collector to the base of the first transistor; a first resistor inserted between the base and the emitter of the first transistor; a third transistor of the first type, whose emitter is connected to the emitter of the first transistor, the base to the connection point of the base of the first transistor and the collector of the second by means of a second resistor, and the collector to the base of the second transistor; a third resistor placed between the base and the emitter of the second transistor; and a control terminal connected to the base of the third transistor.

This switch can be controlled by a pulse applied to the control terminal. In the case where the transistors of the first type are npn transistors, the closing of the device is controlled by a positive pulse. It then remains conductive and its opening is then controlled by the application of a negative pulse. The ratio between the amplitude of the control current and the amplitude of the current passing through the switch is of the order of the product of the gains of the three transistors. Thus, even if these gains are relatively low, particularly for the second transistor, the amplitude of the control pulse is at least 100 times lower than the amplitude of the current passing through the switch.

BRIEF DESCRIPTION OF THE DRAWINGS

The invention is described in greater detail hereinafter relative to non-limitative embodiments and the attached drawings, wherein show:

FIG. 1 in the form of a circuit a switch according to the present invention.

FIG. 2A a safety and control circuit which can be combined with a switch according to the invention.

FIG. 2B wave shapes which assist the description of the operation of the circuit of FIG. 2A.

DETAILED DESCRIPTION OF THE PREFERRED EMBODIMENTS

Figure 3:
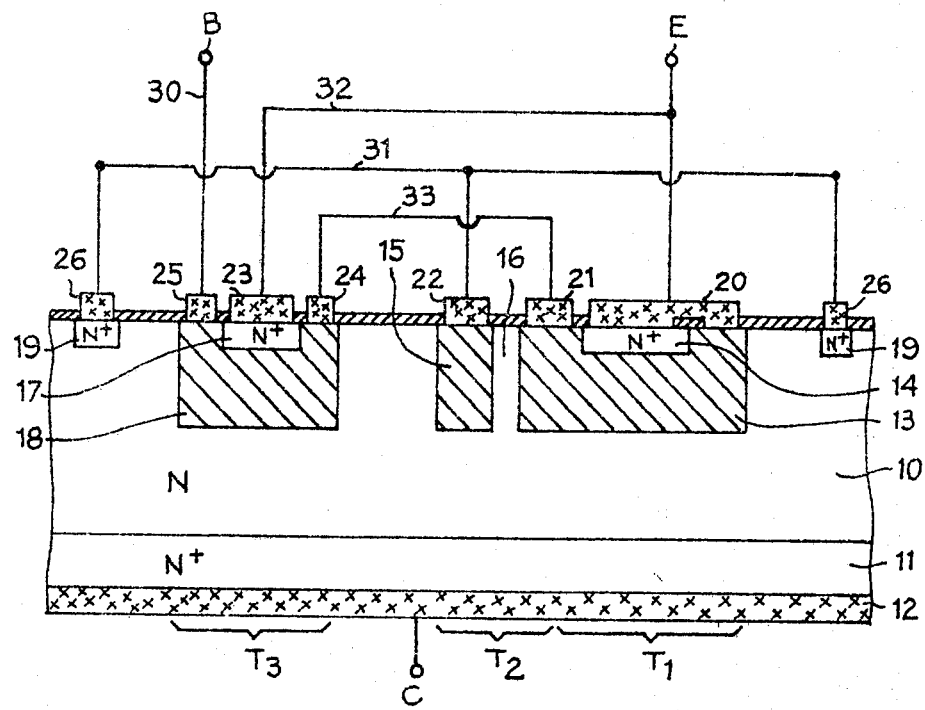
FIG. 3 a very diagrammatic sectional view of an embodiment of the switch according to the invention in integrated form.

FIG. 1 shows an embodiment in the form of an assembly of discrete components of a switch according to the invention. This switch firstly comprises the assembly 1 of a first transistor T1, a second transistor T2 and a resistor R1 arranged in the manner of a so-called mixed Darlington circuit. The first transistor T1 is of the npn type. Its collector is connected to a main terminal C and its emitter to a main terminal E of the switch. The second transistor is of the pnp type. Its emitter is connected to terminal C and its collector to the base of transistor T1. A resistor R1 is placed between the base and the emitter of transistor T1. However, contrary to the conventional mixed Darlington circuit, assembly 1 is not directly connected to any control terminal. The switch according to the invention comprises, apart from assembly 1, a third transistor T3 of the same type as the first transistor T1, namely of the npn type. The base of transistor T3 is connected via a resistor R2 to the base of transistor T1 and to the collector of transistor T2. The collector of transistor T3 is connected to the base of transistor T2. The emitter of transistor T3 is connected to the emitter of transistor T1. The base and emitter of transistor T2 are connected via a resistor R3. The control terminal B of this switch is connected to the base of transistor T3.

Assuming that initially transistor T1 is blocked, the application of a positive voltage to the control electrode B makes the third conductor T3 conductive, followed by transistor T2 and consequently transistor T1. Therefore the base-emitter voltage of transistor T1 becomes positive and supplies the base of transistor T3 via resistor R2. Thus, the system remains conductive as long as a current flows in transistor T1, even if the control current on transistor T3 has disappeared. It is therefore possible to make this assembly conductive by applying a positive pulse, whose amplitude compared with that of the main current which is to pass through transistor T1 is in a ratio at least equal to the product of the gains of the three transistors T1, T2 and T3.

To disconnect transistor T1, it is merely necessary to block transistor T3. This can be carried out by applying to terminal B a voltage which is able to cancel out the base-emitter voltage of transistor T3, i.e. a current corresponding to the ratio between the base-emitter voltage value of transistor T1 and resistor R2. The value of resistor R2 is chosen in such a way that the amplitudes of the opening and closing current pulses are of the same order of magnitude. The switch remains blocked if a positive control pulse is not applied to terminal B.

For example it should be noted that the Applicant has produced the switch according to the invention and as shown in FIG. 1 in the form of an assembly of discrete components. For this purpose transistor T1 is a so-called BUV 18 transistor (80 A saturation collector current with the possibility of a 120 A peak). Transistor T2 is in the form of an ESM 624 transistor able to withstand a 10 A saturation collector current. Transistor T3 is in the form of a low power BD 303 transistor. Resistor R1 has a value of 1 Ohm, resistor R2 a value of 27 Ohms and resistor R3 a value of 4.7 Ohms. When the external circuit is such that the current liable to pass into transistor T1 when the latter is conductive is approximately 120 A, it has been found that a current pulse at terminal B of a few tens of milliamperes, e.g. 50 mA and a duration of a few microseconds is adequate. Thus, it can be assumed that the gain of the circuit is the product of the gain of the three transistors used, i.e. in the case described hereinbefore $10 \times 20 \times 50 = 10,000$. Thus, in theory a 50 mA current is able to control the closing of the device up to intensities of approximately 500 A.

It should be noted that even if the gains of the various transistors used are lower (which may be the case in an integrated circuit, particularly for transistor T2), it is still possible to obtain disconnections for pulses with a reasonable intensity. In the aforementioned example if the gain of transistor T2 was reduced to a value roughly of unity and the gains of transistors T1 and T3 were respectively approximately 10 and 20, there would be a total gain of approximately 200, i.e. a 500 mA control voltage would be sufficient to control a 100 A current on closing.

To open the switch it is necessary to cancel out the base-emitter voltage of transistor T3. It is then appropriate to apply a short duration current pulse (a few microseconds), with a value equal to the base-emitter voltage of the transistor, divided by the value of resistor R2. In the aforementioned example the base-emitter voltage of transistor T1 in conduction is approximately 1.2 V and resistor R2 27 Ohms. It would then merely be necessary to apply a negative pulse of a value of approximately 45 mA. It should be noted that this intensity of the break pulse is only dependent to a limited extent on the specific transistors used, the base-emitter voltages in conduction always being of the same order of magnitude. The device according to the present invention is therefore very easy to disconnect, no matter what the construction and more particularly in the case of a construction in the form of an integrated circuit.

In summarizing it has been shown that it is possible to close the device with a current pulse having an intensity of approximately 50 mA and open it with a current pulse with an intensity of approximately 45 mA.

For comparison purposes it should be noted that for the same current in the main circuit of approximately 120 A, the control currents must be:

for a group of transistors in a Darlington circuit approx. 1.2 A on closing and approx. $-100$ mA to $-2$ A on opening with the significant difference that the closing current must be maintained throughout the conduction period of the switch;

for a device of the gate turn off thyristor type a pulse of approx. 1 A on closing and approx. 2 to 100 A on opening;

for a device of the thyristor type with gate amplification a pulse current of approx. 100 mA on closing and no simple possibility of opening, other than by interrupting the current at the main terminals of the switch.

FIG. 2A shows a control and safety circuit which can be combined with a switch according to the invention. This switch is shown in the form of a block designated by the reference numeral 2. Only the access terminals B, C and E are shown.

This switch can be easily directly controlled by the output of an integrated circuit 3, e.g. a pulse width modulation circuit (PWM) supplying a low level square wave signal when the switch is to be opened and a high level signal when the switch is to be closed. The output signal of circuit 3 is transmitted to a shunt circuit having a capacitor 4 and a resistor 5 in parallel. The output signal of modulator 3 is represented by curve 1 in FIG. 2B and the output signal of circuit 4, 5 by curve 2 in FIG. 2B. Thus, a positive pulse is obtained at the start of each conduction control wave and a negative pulse at the end of each of these square waves. These pulses are able, as has been shown hereinbefore, to directly control terminal B of switch 2.

FIG. 2A also shows a safety circuit which serves to open the switch as soon as the voltage between the main terminals C and E exceeds a predetermined threshold during a conduction phase. This safety circuit comprises a resistor 6 in series with a capacitor 7, which is connected to earth. The intermediate point between the resistor and the capacitor is designated by the reference numeral 8. Thus, at point 8 a signal represented by curve 3 of FIG. 2B is obtained, whose voltage build-up is delayed relative to the output signal of the modulator represented by curve 1 in FIG. 2B. Intermediate point 8 is connected by a Zener diode $D_1$ of threshold voltage $V_Z$ to the base of a transistor T4, whose collector is connected to the terminal B and whose emitter is connected to earth. Point 8 is also connected to terminal C via a diode D2 polarized in the manner shown. Moreover the circuit comprises a plurality of conventional polarization and matching impedances, certain of which are shown. In the case of this circuit as soon as the voltage between the collector and emitter of switch 2 according to the invention exceeds the Zener voltage $V_Z$ of diode D1, transistor T4 becomes conductive, terminal B is connected to earth and this leads to a disconnection of the switch. Thus, with the switch according to the invention it is possible to obtain a particularly simple safety circuit due to the fact that this switch can be controlled on opening by low intensity pulses.

Figure 4:
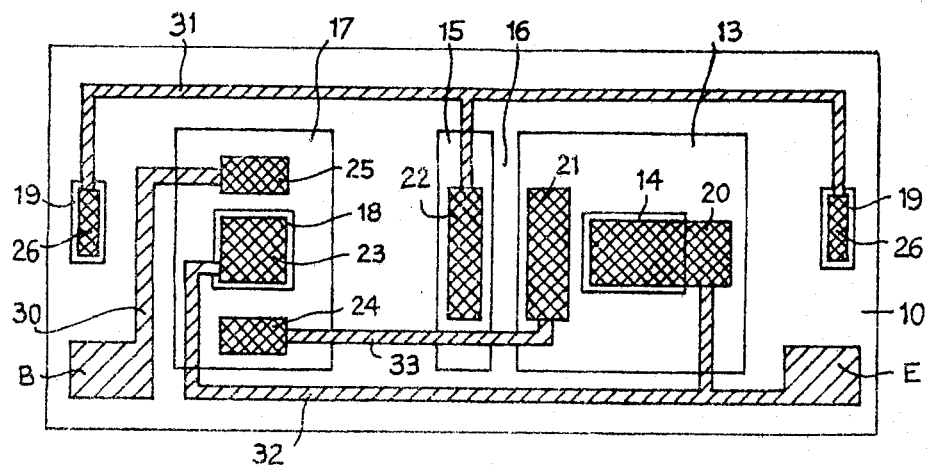
FIG. 4 a very diagrammatic plan view of an embodiment of an integrated switch according to the invention.

FIGS. 3 and 4 respectively show a sectional view and a plan view of a possible integration of a switch according to the invention. This integration mode is one example from among the many which are possible. It should be noted that FIGS. 3 and 4 are highly diagrammatic and that the plan view does not correspond strictly to the sectional view, the arrangement of certain areas having been modified to make the drawings more legible and informative. In addition, in accordance with the representation procedure adopted for semiconductor devices, the different areas and layers have not been shown to scale with respect to one another, certain of them being shown larger or smaller in order to facilitate the understanding of the drawings.

In FIG. 3 the switch is produced on a type N semiconductor substrate (usually silicon). The areas with wide hatching indicate the areas where there is a type P conductivity. The more closely hatched areas represent $SiO_2$ layers. The areas marked with crosses represent metal coverings. In FIG. 4 the hatched areas represent metal coverings resting on insulated areas (e.g. of silica) and the areas marked with crossed hatching represent metal coverings in contact with the underlying semiconductor. In the right-hand part of the drawing it is possible to see transistor T1 in the form of a vertical planar transistor (transverse to the silicon wafer). The collector of this transistor comprises the type n substrate 10 and a contact recovery overdoped area 11 on which is deposited a metal covering 12. The base layer of transistor T1 is formed by a type P diffused area 13 and its emitter is constituted by a type n+ area 14 formed within area 13. Transistor T2 is of the lateral type and comprises a type p area 15 as the emitter area, a portion 16 of substrate 10 as the base area and a portion of area 13 of the p type as the collector area. Transistor T3 is constructed in vertical form in the same way as transistor T1 and comprises a type n+ emitter area 17 located within a type p base area 18, the collector corresponding to portions of layers 10 and 11. In this structure there are also type n+ areas formed from the upper face of the substrate and collectively designated by the reference 19. They serve to form resistors between the metal coverings on the upper face and the metal covering on the lower face. Transistor T1 occupies a much larger surface area than that occupied by transistor T3, bearing in mind that transistor T1 has to be able to withstand high voltages and permit the passage of high currents. In practice the size difference is much more marked than that diagrammatically shown in the drawing.

The metal coverings in contact with the underlying silicon are constituted by a metal covering 20 astride layers 13 and 14, a metal covering 21 over a portion of layer 13 remote from that on which rests coating 20, a metal covering 22 on layer 15, a metal covering 23 on layer 17, metal coverings 24 and 25 which are remote from one another on layer 18 and metal coverings 26 on layers 19. Other insulated metal coverings join said first metal coverings to other coverings or contact elements. A first insulated metal covering 30 connects the base metal covering 25 of transistor T3 to a connector B. A second insulated metal covering 31 connects metal coverings 26 and 22, i.e. it connects the emitter of transistor T2 to the collector of transistor T1 by means of a resistor corresponding to the thickness of the substrate. This resistance can be minimized by increasing the depth of the type N+ diffusions 19. A third insulated metal covering 32 connects metal coverings 20 and 23 to one another and to E, which is a main terminal of the switch. The connection between metal coverings 20 and 23 corresponds to the connection between the emitters of transistors T1 and T3, the metal covering 20 connecting the emitter to the base of the transistor T1 corresponding to the connection between the base and emitter of transistor T1 via a resistor R1. A fourth insulated metal covering 33 connects metal coverings 21 and 24. Metal covering 33 corresponds to a connection between the collector of transistor T2 and the base of transistor T3 via a resistor R2, which corresponds to the area of layer 18 between metal coverings 24 and 25.

As will be obvious the bringing about of this integration involves the existence of distributed resistors, other than resistors R1, R2 and R3. Thus, there are resistors between the base of transistor T2 and the collector of transistor T3, as well as between the emitter of transistor T2 and the collector of transistor T1. The shapes and sizes of the real integrated structure are intended to minimize these parasitic resistances, but in any case they have little influence on the operation of the device. Other integration diagrams are possible and lead to other parasitic resistances. It should also be noted that it is possible to integrate only part of the components of FIG. 1. For example the assembly constituting the mixed Darlington circuit 1 has already been proposed.

The invention is not limited to the embodiments described and shown and numerous variants are possible thereto without passing beyond the scope of the invention.

What is claimed is:

1. A switch whose opening and closing is controlled by pulses comprising;
   main terminals corresponding to the collector and emitter of a first power transistor of a first type and a second transistor of a second type connected by its emitter to the collector of said first transistor and by its collector to the base of said first transistor, a first resistor being inserted between the base and emitter of said first transistor;
   a third transistor of the first type, whose emitter is connected to the emitter of the first transistor, the base to the connection point of the base of the first transistor and the collector of the second transistor via a second resistor and the collector to the base of the second transistor; a third resistor being connected between the base and the emitter of the second transistor; and a control terminal being connected to the base of the third transistor.

2. A switch according to claim 1, wherein said transistors of the first type are npn transistors and the transistor of the second type is a pnp transistor.

3. A switch according to claim 1, wherein the gain of the second transistor is approximately unity.

4. A switch according to claim 1, wherein it is constructed in the form of a circuit constituted by discrete components.

5. A switch according to claim 1, wherein at least certain of the components forming said switch are combined into an integrated circuit.

6. A switch according to claim 5, in the form of a unitary component on a semiconductor substrate having a first conductivity type, wherein the first and third transistors are of the planar transistor type transverse to the substrate, the second transistor being in the form of a lateral transistor, its base corresponding to an area of the substrate and its collector to an area of the second conductivity type, which also corresponds to the base of the first transistor.

7. A switch according to claim 1, wherein its control terminal receives the output of a pulse width modulation control circuit via a differentiating circuit supplying a pulse of a first direction during rises of the control square wave pulses and a pulse of a second polarity during drops of the control square wave pulses.

8. A switch according to claim 1, which also comprises a safety circuit which automatically brings it into the disconnection state when it is in the conductive state and when the voltage between the main terminals exceeds a predetermined threshold value, wherein said safety circuit comprises a fourth transistor connected between the control terminal and a main terminal of the switch, the base of this fourth transistor being connected to the other main terminal of the switch by means of a Zener diode in series with a rectifier diode, the connection point between the Zener diode and the rectifier diode being connected to a circuit such as a capacitor delaying a voltage corresponding to a conduction control.

* * * * *